(12) United States Patent
Geng et al.

(10) Patent No.: US 11,817,308 B2
(45) Date of Patent: Nov. 14, 2023

(54) DISPLAY PANEL AND MANUFACTURING METHOD THEREOF

(71) Applicant: Shenzhen China Star Optoelectronics Semiconductor Display Technology Co., Ltd., Guangdong (CN)

(72) Inventors: Jing Geng, Guangdong (CN); Dongze Li, Guangdong (CN); Yong Fan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 611 days.

(21) Appl. No.: 17/040,990

(22) PCT Filed: Jul. 2, 2020

(86) PCT No.: PCT/CN2020/099862
§ 371 (c)(1),
(2) Date: Sep. 24, 2020

(87) PCT Pub. No.: WO2021/243786
PCT Pub. Date: Dec. 9, 2021

(65) Prior Publication Data
US 2023/0117381 A1    Apr. 20, 2023

(30) Foreign Application Priority Data
Jun. 2, 2020    (CN) .......................... 202010489129.9

(51) Int. Cl.
*H01L 33/50* (2010.01)
*H01L 25/16* (2023.01)

(52) U.S. Cl.
CPC .......... *H01L 33/507* (2013.01); *H01L 25/167* (2013.01); *H01L 33/502* (2013.01); *H01L 2933/0041* (2013.01)

(58) Field of Classification Search
CPC ... H01L 33/507; H01L 25/167; H01L 33/502; H01L 2933/0041; H01L 2933/0091;
(Continued)

(56) References Cited

U.S. PATENT DOCUMENTS

| 2016/0013366 A1* | 1/2016 | Hwang | ................... H01L 33/08 257/13 |
| 2018/0097033 A1* | 4/2018 | Ahmed | ................. H01L 27/156 |

(Continued)

FOREIGN PATENT DOCUMENTS

| CN | 107393938 | 11/2017 |
| CN | 110429096 | 11/2019 |

(Continued)

*Primary Examiner* — Jonathan Han

(57) ABSTRACT

A display panel and a manufacturing method of the display panel are provided. The display panel includes: a first substrate, a second substrate disposed opposite to the first substrate, a driving circuit disposed opposite to the first substrate and adjacent to a side of the second substrate, and a color resist layer disposed opposite to the driving circuit and adjacent to a side of the first substrate; wherein the color resist layer includes colorized color resist layers and a colorized quantum dot layer, and the driving circuit is a bottom-emission type light-emitting-diode (LED) driving circuit.

20 Claims, 5 Drawing Sheets

(58) Field of Classification Search
CPC ... H01L 33/58; H01L 25/0753; H01L 27/156; H01L 33/508; H01L 33/54; H01L 33/60
See application file for complete search history.

(56) References Cited

U.S. PATENT DOCUMENTS

2018/0323116 A1\* 11/2018 Wu ................ H01L 25/0753
2020/0152841 A1   5/2020 Han et al.
2020/0402868 A1  12/2020 Wu et al.

FOREIGN PATENT DOCUMENTS

| | | |
|---|---|---|
| CN | 111052418 | 4/2020 |
| CN | 108807450 | 8/2021 |
| WO | WO 2019/230328 | 12/2019 |
| WO | WO 2020/100301 | 5/2020 |

\* cited by examiner

S10, providing a third substrate and depositing a polyimide film on a side of the third substrate

⇩

S20, forming a thin film transistor layer on a side of the polyimide film facing away from the third substrate

⇩

S30, forming a blue micro-LED layer on a side of the thin film transistor layer facing away from the polyimide film

⇩

S40, forming a second substrate on a side of the blue micro-LED layer facing away from the thin film transistor layer

⇩

S50, peeling off the third substrate by a laser peeling method

⇩

S60, forming black matrixes on a side of a first substrate to separate various color resist layers

⇩

S70, manufacturing colorized color resist layers by a photo-lithography process, wherein the colorized color resist layers include red color resist layers, green color resist layers, and transparent color resist layers

⇩

S80, depositing an insulating layer on a side of the colorized color resist layers by a chemical vapor deposition method

⇩

S90, forming a black pixel defining layer on a side of the insulating layer facing away from the colorized color resist layers by another photo-lithography process, wherein the black pixel defining layer is disposed opposite to the

⇩

S100, alternately injecting red quantum dots and green quantum dots in various regions separated by the black pixel defining layer

⇩

S110, correspondingly pairing a side of the polyimide film to a side of a colorized quantum dot layer.

FIG. 2

DISPLAY PANEL AND MANUFACTURING METHOD THEREOF

RELATED APPLICATIONS

This application is a National Phase of PCT Patent Application No. PCT/CN2020/099862 having International filing date of Jul. 2, 2020, which claims the benefit of priority of Chinese Patent Application No. 202010489129.9 filed on Jun. 2, 2020. The contents of the above applications are all incorporated by reference as if fully set forth herein in their entirety.

FIELD AND BACKGROUND OF THE INVENTION

The present disclosure relates to the field of display technologies, and particularly relates to a display panel and a manufacturing method of the display panel.

BACKGROUND OF INVENTION

Compared with organic light-emitting diode (OLED) display devices, micro light-emitting diode (micro-LED) display devices have advantages of higher reliability, higher color gamut, greater brightness, greater transparency, higher pixels per inch (PPI) density, and lower packaging requirements. It is easier to realize flexible and seamless splicing displays, which is a future display device with great development potential in the future.

On the other hand, a greater height of micro-LED chips makes a lateral light emission of the micro-LED display device very serious. If a conventional top-emitting micro-LED is adopted, crosstalk occurs in a display panel, thereby seriously affecting contrast and color purity of the display devices. Furthermore, during a process of pairing an upper substrate and a lower substrate, a vacuum pressure may crush the micro-LED chips, making them inoperative, thereby affecting an overall display effect.

Thereby, in micro-LED display device technology in the prior art, there is still a problem that a height of the micro-LED chips of a display panel is too high, so the display panel is prone to crosstalk during display, which affects the display quality of the display panel and needs to be improved urgently.

SUMMARY OF THE INVENTION

The present disclosure relates to a display panel and a manufacturing method of the display panel, which are used to solve problems in the prior art that a height of micro-LED chips of the display panel is too high, so the display panel is prone to crosstalk during display, which affects display quality of the display panel.

In order to solve the above problems, technical solutions provided by the present disclosure are as followings:

The present disclosure provides a display panel, the display panel includes:
a first structure;
a second substrate disposed opposite to the first substrate;
a driving circuit disposed opposite to the first substrate and adjacent to a side of the second substrate; and
a color resist layer disposed opposite to the driving circuit and adjacent to a side of the first substrate;
wherein the color resist layer includes colorized color resist layers and colorized quantum dot layers, the driving circuit is a bottom-emission type light-emitting-diode (LED) driving circuit, and quantum dots or scattering particles are disposed in the colorized quantum dot layers.

According to an embodiment of the present disclosure, wherein the driving circuit includes a blue micro-LED layer and an adhesive layer disposed around the blue micro-LED layer.

According to an embodiment of the present disclosure, wherein the adhesive layer is a white adhesive layer.

According to an embodiment the present disclosure, wherein a thickness of the white adhesive layer is greater than a thickness of the blue micro-LED layer, and the blue micro-LED layer has a certain preset thickness.

According to an embodiment the present disclosure, wherein the preset thickness of the blue micro-LED layer ranges from 90 um to 190 um.

According to an embodiment of the present disclosure, wherein the colorized color resist layers includes red color resist layers, green color resist layers, and transparent color resist layers, the colorized quantum dot layers includes red quantum dot regions, green quantum dot regions, and transparent regions, and the colorized color resist layers with various colors are disposed opposite to the blue micro-LED layer and are separated from each other.

According to an embodiment of the present disclosure, wherein the red color resist layers are disposed opposite to the red quantum dot regions, the green color resist layers are disposed opposite to the green quantum dot regions, and the transparent color resist layers are disposed opposite to the transparent regions.

According to an embodiment of the present disclosure, wherein a polyimide film and a thin film transistor layer are further disposed between the driving circuit and the second substrate, the thin film transistor layer is electrically connected to the driving circuit, a thickness of the polyimide film is less than a thickness of the blue micro-LED layer, and the polyimide film has a certain preset thickness.

According to an embodiment of the present disclosure, wherein the preset thickness of the polyimide film ranges from 10 um to 19 um.

According to an embodiment of the present disclosure, wherein the first substrate and the second substrate are glass substrates.

The present disclosure further provides a display panel, the display panel includes:
a first substrate;
a second substrate disposed opposite to the first substrate;
a driving circuit disposed opposite to the first substrate and adjacent to a side of the second substrate; and
a color resist layer disposed opposite to the driving circuit and adjacent to a side of the first substrate;
wherein the color resist layer includes colorized color resist layers and colorized quantum dot layers, the driving circuit is a bottom-emission type light-emitting-diode (LED) driving circuit.

According to an embodiment of the present disclosure, wherein the driving circuit includes a blue micro-LED layer and an adhesive layer disposed around the blue micro-LED layer.

According to an embodiment of the present disclosure, wherein the adhesive layer is a white adhesive layer.

According to an embodiment of the present disclosure, wherein a thickness of the white adhesive layer is greater than a thickness of the blue micro-LED layer, and the blue micro-LED layer has a certain preset thickness.

According to an embodiment of the present disclosure, wherein the preset thickness of the blue micro-LED layer ranges from 90 um to 190 um.

According to an embodiment of the present disclosure, wherein the colorized color resist layers includes red color resist layers, green color resist layers, and transparent color resist layers, the colorized quantum dot layers includes red quantum dot regions, green quantum dot regions, and transparent regions, and the colorized color resist layers with various colors are disposed opposite to the blue micro-LED layer and are separated from each other.

According to an embodiment of the present disclosure, wherein the red color resist layers are disposed opposite to the red quantum dot regions, the green color resist layers are disposed opposite to the green quantum dot regions, and the transparent color resist layers are disposed opposite to the transparent regions.

According to an embodiment of the present disclosure, wherein a polyimide film and a thin film transistor layer are further disposed between the driving circuit and the second substrate, the thin film transistor layer is electrically connected to the driving circuit, a thickness of the polyimide film is less than a thickness of the blue micro-LED layer, and the polyimide film has a certain preset thickness.

According to an embodiment of the present disclosure, wherein the preset thickness of the polyimide film ranges from 10 um to 19 um.

An embodiment of the present disclosure provides a manufacturing method of the display panel, including: manufacturing a backlight substrate and manufacturing a color filter substrate;

firstly, steps for manufacturing the backlight substrate including:

S10, providing a third substrate, and depositing a polyimide film on a side of the third substrate;

S20, forming a thin film transistor layer on a side of the polyimide film facing away from the third substrate;

S30, forming a blue micro-LED layer on a side of the thin film transistor layer facing away from the polyimide film;

S40, forming a second substrate on a side of the blue micro-LED layer facing away from the thin film transistor layer; and S50, peeling off the third substrate by a laser peeling method;

then, steps for manufacturing the color filter substrate including:

S60, forming black matrixes (BM) on a side of a first substrate to separate various color resist layers;

S70, manufacturing colorized color resist layers by a photo-lithography process, wherein the colorized color resist layers include red color resist layers, green color resist layers, and transparent color resist layers;

S80, depositing an insulating layer on a side of the colorized color resist layers by a chemical vapor deposition method;

S90, forming a black pixel defining layer on a side of the insulating layer facing away from the colorized color resist layers by another photo-lithography process, wherein the black pixel defining layer is disposed opposite to the black matrixes; and S100, alternately injecting red quantum dots and green quantum dots in various regions separated by the black pixel defining layer; and lastly, assembling the backlight substrate and the color filter substrate:

S110, correspondingly pairing a side of the polyimide film to a side of a colorized quantum dot layer.

Compared with the prior art, the display panel and the manufacturing method of the display panel provided by the present disclosure have following beneficial effects:

1. Firstly, in the display panel provided by the present disclosure, the blue micro-LED layer has a certain preset thickness, and the preset thickness of the blue micro-LED layer ranges from 90 um to 190 um, thereby avoiding a possibility of pressure crushing the blue micro-LED layer during a process of pairing an upper and a lower substrates due to a too high height of the chips.

2. Secondly, in the display panel provided by the present disclosure, a white adhesive layer is provided around the blue micro-LED layer. The white adhesive layer surrounds the blue micro-LED layer to protect the blue micro-LED layer, thereby preventing the blue micro-LED layer from being damaged during a manufacturing process. The white adhesive layer can also reflect a light emitted by the blue micro-LED layer, so all the light is gathered in an emission direction at a bottom of the display panel, thereby improving a utilization rate, brightness and contrast of light.

3. Furthermore, the thickness of the white adhesive layer is greater than the thickness of the blue micro-LED layer, so during the process of pairing the upper and the lower substrates, an upper surface and a lower surface of the blue micro-LEDs can also be protected to prevent the blue micro-LEDs from being crushed or broken by the pressure to affect display quality.

4. Lastly, the color resist layer includes colorized color resist layers and a colorized quantum dot layer, the colorized color resist layers includes red color resist layers, green color resist layers, and transparent color resist layers, the colorized quantum dot layer includes red quantum dot regions, green quantum dot regions, and transparent regions, and the resist layers with various colors are disposed opposite to the blue micro-LED layer and are separated from each other by the black matrixes, thereby avoiding the crosstalk of the display panel, which affects the display quality of the display panel, and further improving the brightness and contrast of the red, green, and blue sub-pixels.

BRIEF DESCRIPTION OF THE SEVERAL VIEWS OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained by those skilled in the art based on these drawings without paying any creative effort.

FIG. 2 is a flowchart of a manufacturing method of a display panel provided by an embodiment of the present disclosure.

DESCRIPTION OF SPECIFIC EMBODIMENTS OF THE INVENTION

Figure 1:
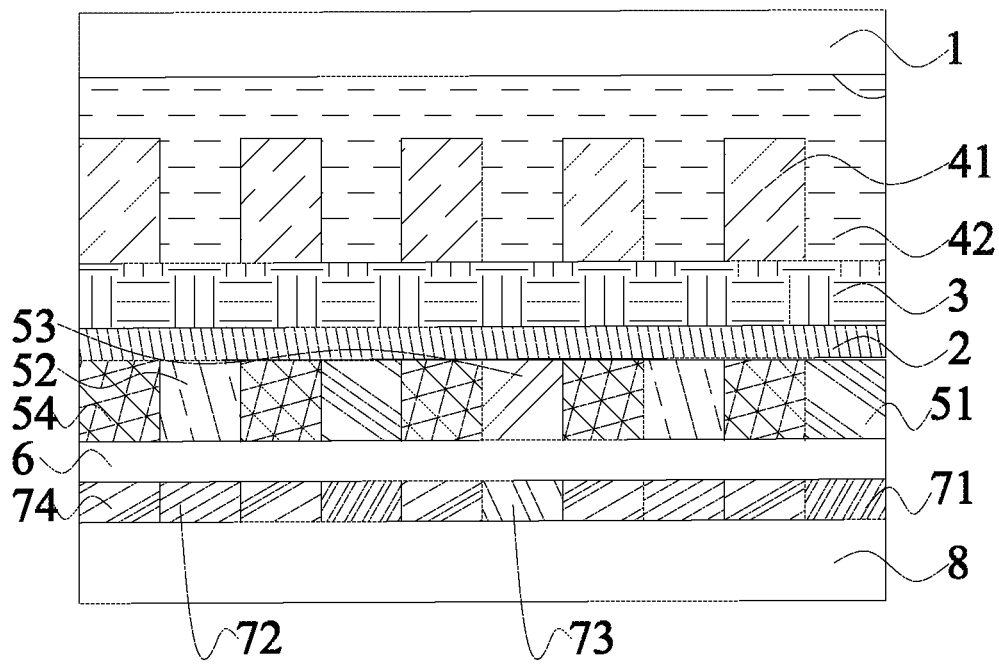
FIG. 1 is a structural schematic view of a display panel provided by an embodiment of the present disclosure.
Figure 1A:
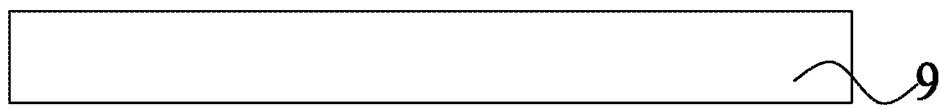
FIGS. 1A, 1B, 1C, 1D, 1E, 1F, 1G, 1H, 1I, 1J, 1K, 1L and 1M are schematic views showing a manufacturing process of the display panel provided by an embodiment of the present disclosure.
Figure 1B:
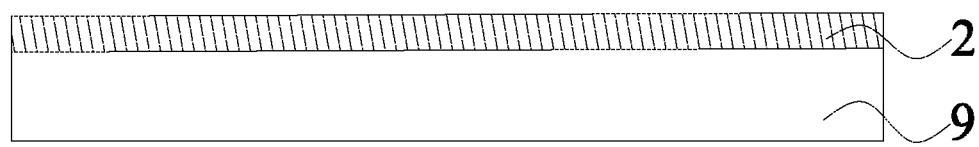
Figure 1C:
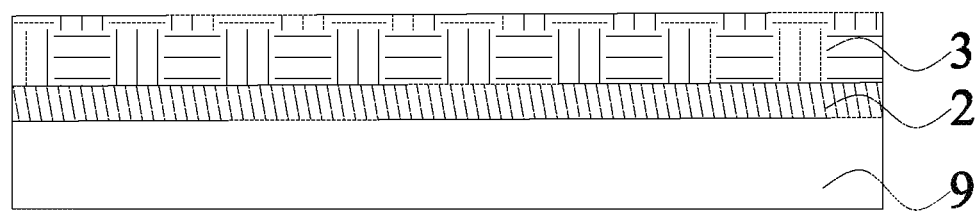
Figure 1D:
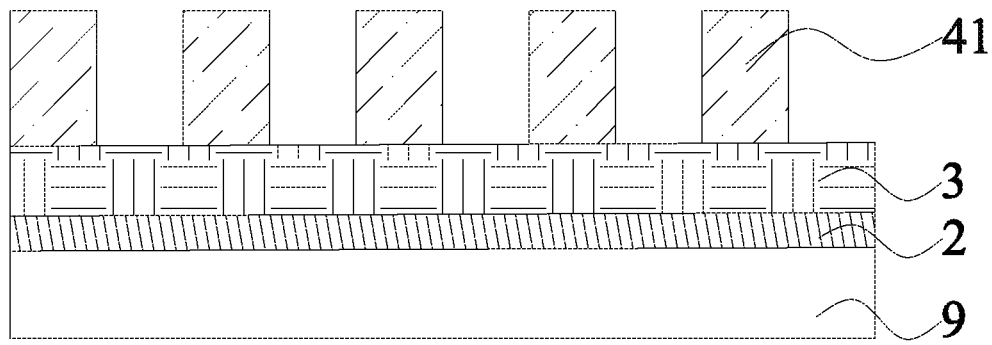
Figure 1E:
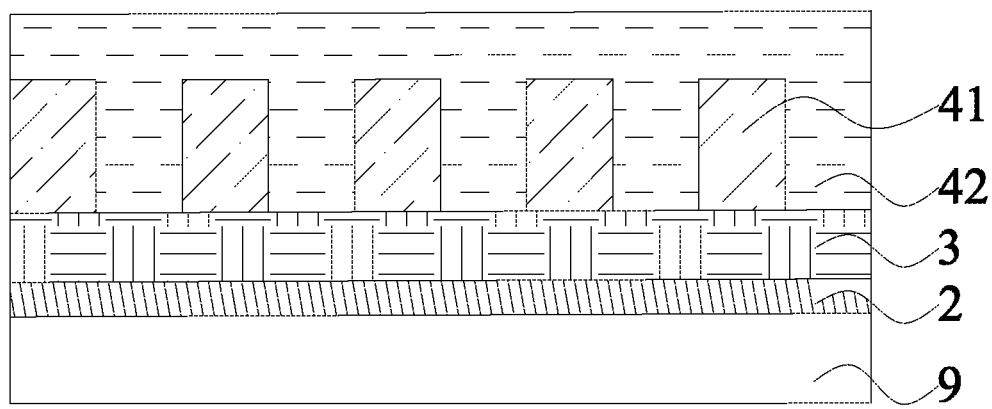
Figure 1F:
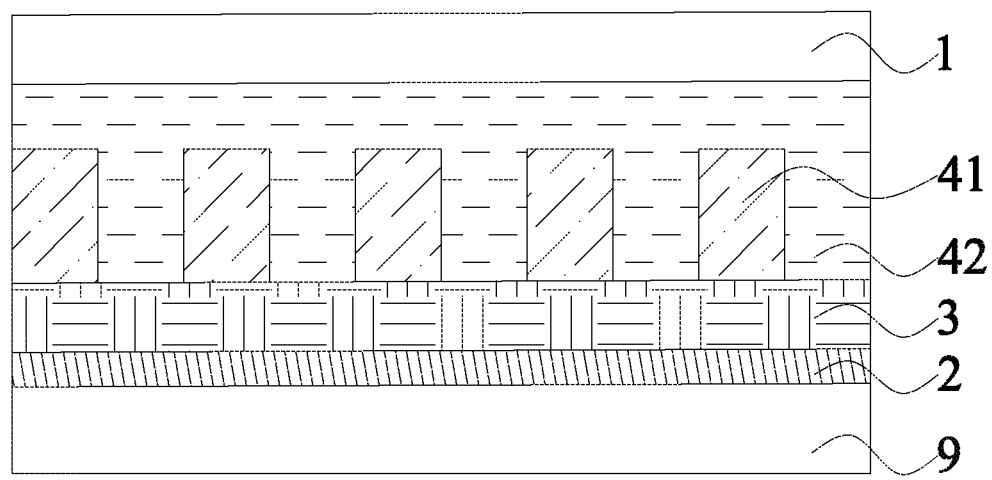
Figure 1G:
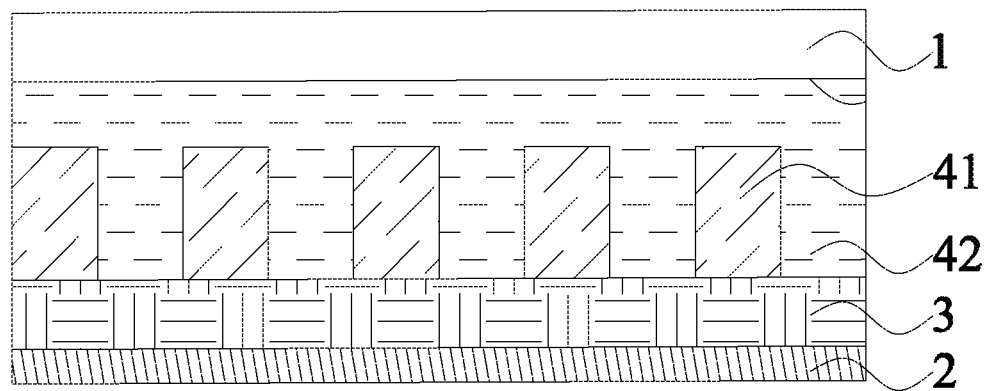
Figure 1H:
Figure 1I:
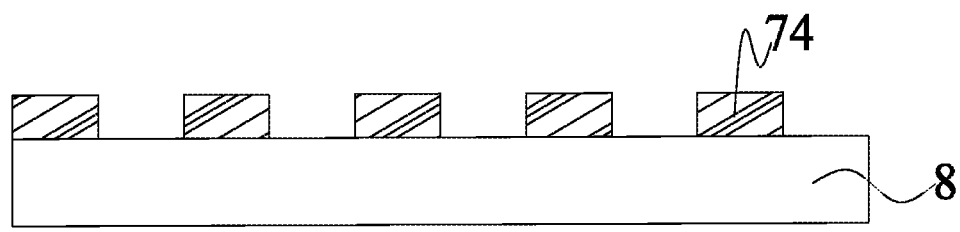
Figure 1J:
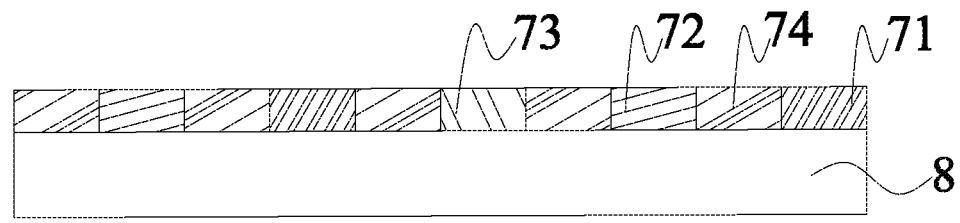
Figure 1K:
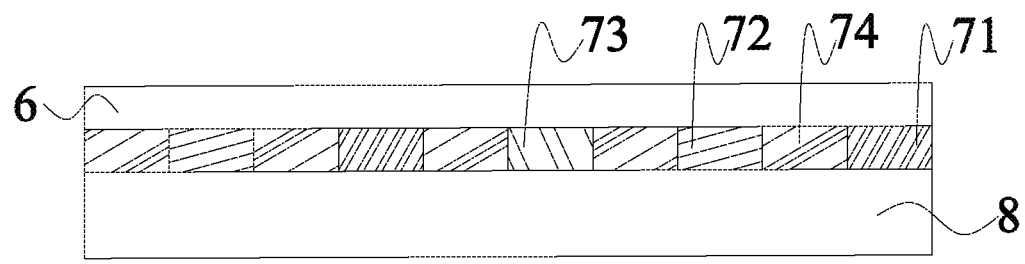
Figure 1L:
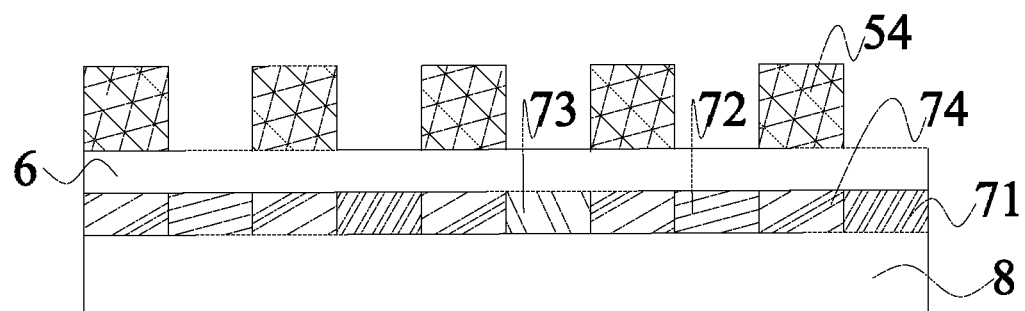
Figure 1M:
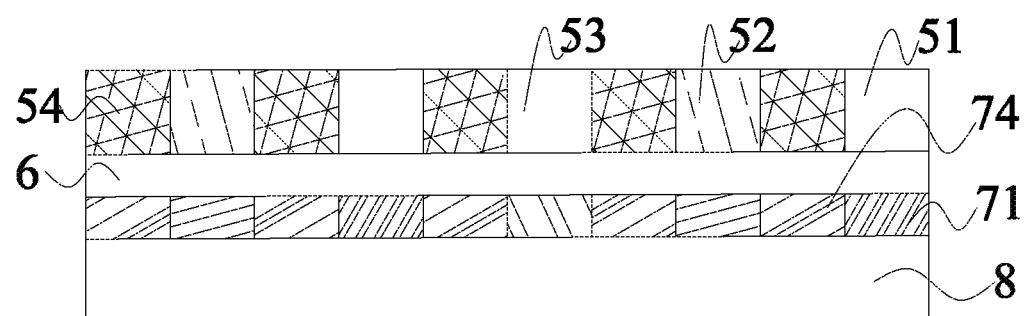

The technical solutions in the embodiments of the present disclosure will be clearly and completely described with reference to accompanying drawings in the embodiments of the present disclosure. Obviously, described embodiments are only a part of the embodiments of the present disclosure, but not all the embodiments. Based on the embodiments in the present disclosure, all other embodiments obtained by those skilled in the art without creative work fall into protection scope of the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount" "connect" and "couple" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interaction between two elements. A person skilled in the art should understand the specific meanings in the present disclosure according to specific situations.

In the description of the present disclosure, unless specified or limited otherwise, it should be noted that, a structure in which a first feature is "on" or "under" a second feature may include an embodiment in which the first feature directly contacts the second feature and may also include an embodiment in which an additional feature is formed between the first feature and the second feature so that the first feature does not directly contact the second feature. Furthermore, a first feature "on", "above", or "upon" a second feature may include an embodiment in which the first feature is right "on", "above", or "upon" the second feature and may also include an embodiment in which the first feature is not right "on", "above", or "upon" the second feature, or just means that the first feature has a sea level elevation greater than the sea level elevation of the second feature. While first feature "under" "below", or "on bottom of" a second feature may include an embodiment in which the first feature is right "under" "below", or "on bottom of" the second feature and may also include an embodiment in which the first feature is not right "under", "below", or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or disclosure of other materials may be appreciated by a person skilled in the art.

The present disclosure provides a display panel and a manufacturing method of the display panel. For details, referring to FIG. 1 to FIG. 2.

A height of micro-LED chips in a conventional micro-LED display panel is high, which makes a lateral light emission of the micro-LED display devices very serious; if a conventional top-emitting micro-LED is adopted, crosstalk occurs in the display panel, thereby seriously affecting contrast and color purity of the display devices, and further affecting display quality of the display panel. Thereby, the present disclosure provides a micro-LED display panel and a manufacturing method of the display panel.

Referring to FIG. 1, a structural schematic view of a display panel provided by the present disclosure, the display panel includes:
 a first substrate 8;
 a second substrate 1 disposed opposite to the first substrate 8;
 a driving circuit disposed opposite to the first substrate 8 and adjacent to a side of the second substrate 1; and
 a color resist layer disposed opposite to the driving circuit and adjacent to a side of the first substrate 8;
 wherein the color resist layer includes colorized color resist layers 7 and a colorized quantum dot layer 5, the driving circuit is a bottom-emission type LED driving circuit. Furthermore, quantum dots or scattering particles are disposed in the colorized quantum dot layer 5.

In an embodiment of the present disclosure, the display panel is a micro-LED display panel, which refers to an LED miniaturization and matrix technology, in short, an LED backlight is thinned, miniaturized, and arranged into an array, which can reduce a size of the LED units to under 100 um, and allows the LED units to be on par with OLEDs in that each can be individually addressed and driven to emit light (self-luminescence); in another embodiment of the present disclosure, the display panel is a mini-LED (sub-millimeter LED) display panel. A granular dimension of the mini-LED display panel is greater than 50 um and less than 250 um. The mini-LED is a hybrid between a conventional LED and a micro-LED and is an improved version based on the conventional LED backlight.

In an embodiment of the present disclosure, the driving circuit includes a blue micro-LED layer and an adhesive layer 42 disposed around the blue micro-LED layer 41. The adhesive layer 42 is a white adhesive layer.

Furthermore, a thickness of the white adhesive layer is greater than a thickness of the blue micro-LED layer 41, so that the white adhesive layer completely coats the blue micro-LED layer 41. On one hand, the white adhesive layer protects the blue micro-LED layer 41 and prevents a surface of the blue micro-LED layer 41 from being damaged during manufacturing processes, which affects the display quality of the display panel. On the other hand, the white adhesive layer gathers light emitted by the blue micro-LED layer 41, so that all light is gathered in an emission direction of a bottom of the display panel, which improves a light utilization rate, brightness, and contrast.

Furthermore, an additional layer of black adhesive layer 43 may be provided on all sides of the white adhesive layer except the side close to the colorized quantum dots 5 (a side used for emitting light from the blue micro-LED layer 41) to further gather light emitted by the blue micro-LED layer 41, thereby preventing light leakage and improving a light brightness and contrast of the display panel.

Furthermore, the blue micro-LED layer 41 has a certain preset thickness, and the preset thickness of the blue micro-LED layer 41 ranges from 90 um to 190 um.

In an embodiment of the present disclosure, the colorized color resist layers 7 include red (R) color resist layers 71, green (G) color resist layers 72, and transparent (T) color resist layers 73, black matrixes 74 are disposed between the colorized color resist layers to separate the colorized color resist layers, thereby preventing crosstalk of different colors of the colorized color resist layers 7. The colorized quantum dot layer 5 includes red quantum dot regions 51, green quantum dot regions 52, and transparent regions 53. Red quantum dots are injected into the red quantum dot regions 51, green quantum dots are injected into the green quantum dot regions 52, and transparent quantum dots are injected into the transparent regions 53. The colorized quantum dot layer 5 are blocked by a black pixel defining layer 54 so that the colorized quantum dot layer 5 can be divided into many quantum dot regions with different color to respectively inject quantum dots with different colors, which can effectively use light energy and can prevent color interference between pixels in the micro-LED quantum dot layer. The black pixel defining layer 54 and the black matrixes 74 may use a same material or different materials. In order to enable various colorized inks of different colors to be printed into corresponding regions to form shapes of corresponding sub-pixels, the black pixel defining layer 54 needs to be provided on a printing substrate and ink is printed into holes defined in the black pixel defining layer 54. A common similarity of the black pixel defining layer 54 and the black matrixes 74 is to shield light and separate colorized resists of different colors. The colorized color resist layers 5 with various colors are disposed opposite to the blue micro-LED layer 41 and are separated from each other, that is, the blue micro-LED layer 41 includes a plurality of blue micro-LEDs which are separated from each other, each blue micro-LED is disposed opposite to one of the colorized color resist layers 7 which may be a red color resist layer 71, a green color resist layer 72, or a transparent color resist layer 73. In this way, a color of a region corresponding to each of the colorized color resist layers 7 is concentrated, thereby being beneficial to improve the brightness and contrast of each region of the colorized color resist layers 7.

Furthermore, the colorized quantum dot layer 5 may also be called as a color conversion layer, which can convert a color of light emitted by the blue micro-LED layer 41, in other words, when light emitted by the blue micro-LED layer 41 passes through the red quantum dot regions 51, it becomes red light, when light emitted by the blue micro-LED layer 41 passes through the green quantum dot regions 52, it becomes green light, when light emitted by the blue micro-LED layer 41 passes through the transparent regions 53, it directly emits blue light, which in turn can form an RGB (red/green/blue) sub-pixel unit.

Furthermore, the red color resist layers 71 are disposed opposite to the red quantum dot regions 51, the green color resist layers 72 are disposed opposite to the green quantum dot regions 52, and the transparent color resist layers 73 are disposed opposite to the transparent regions 53.

In an embodiment of the present disclosure, a polyimide film 2 and a thin film transistor layer 3 are also disposed between the driving circuit and the second substrate 1. The thin film transistor layer 3 is electrically connected to the driving circuit. A thickness of the polyimide film 2 is less than a thickness of the blue micro-LED layer 41, and the polyimide film 2 has a certain preset thickness. Furthermore, the preset thickness of the polyimide film 2 ranges from 10 um to 19 um.

Furthermore, the first substrate 8, the second substrate 1, and a third substrate 9 may all be glass substrates or resin substrates.

Furthermore, the driving circuit may be not only a thin film transistor (TFT) driving circuit matched with a thin film transistor, but also a complementary metal oxide semiconductor (CMOS) driving circuit. When the driving circuit is a CMOS driving circuit, the second substrate also uses a corresponding CMOS substrate.

Referring to FIG. 1A to FIG. 1M, and FIG. 2, the present disclosure also provides a manufacturing method of the display panel, including:

manufacturing a backlight substrate and a color filter substrate.

firstly, steps for manufacturing the backlight substrate include:

S10, providing the third substrate 9 and depositing a polyimide film 2 on a side of the third substrate 9. The third substrate 9 may be a glass substrate or a resin substrate etc., and is used to support the thin film transistor layer 3 and the driving circuit, and can also be used as a medium between the bottom emission type driving circuit and the colorized quantum dot ink. Thus, the polyimide film 2 has a certain preset thickness, the preset thickness of the polyimide film 2 ranges from 10 um to 19 um, thereby reducing a thickness of the bottom-emission type micro-LED driving circuit and avoiding the problem that the height of the chip of the micro-LED/mini-LED display panel is too high, which causes crosstalk of the display panel during display.

S20, forming the thin film transistor layer 3 on a side of the polyimide film 2 facing away from the third substrate 9. The thin film transistor layer 3 is electrically connected to the blue micro-LED layer 41 and is used to drive the blue micro-LED layer 41.

S30, forming a blue micro-LED layer 41 on a side of the thin film transistor layer 3 facing away from the polyimide film 2. The blue micro-LED layer 41 emits blue light to excite the red and the green quantum dots, so that red sub-pixels and green sub-pixels are formed respectively, at the same time, blue sub-pixels are formed when passing through transparent regions, so that multiple RGB sub-pixel units can be formed. In addition, a white adhesive layer 42 is provided around the blue micro-LED layer 41. The white adhesive layer 42 encapsulates the blue micro-LED layer 41, on the one hand, it plays a protective role on surfaces of the blue micro-LED layer 41 to prevent damage to the blue micro-LED layer 41 during the manufacturing process, on the other hand, the white adhesive layer 42 can also gather the light emitted by the blue micro-LED layer 41 and concentrate all the light in a bottom reflection direction of the blue micro-LED layer 41 to improve a light utilization rate, brightness and contrast in each of the colorized quantum dot regions.

S40, forming a second substrate 1 on a side of the blue micro-LED layer 41 facing away from the thin film transistor layer 3. A side of the white adhesive layer 42 facing away from the thin film transistor layer 3 is smoothed, and then the second substrate 1 is formed thereon, after the third substrate 9 is peeled off, it serves as a support for the driving circuit, thereby providing convenience for subsequent pairing.

S50, peeling off the third substrate 9 by a laser peeling method.

Then, steps for manufacturing the color filter substrate 5 include:

S60, forming black matrixes 74 on a side of a first substrate 8 to separate various color resist layers, thereby preventing crosstalk of the colors of adjacent sub-pixels;

S70, manufacturing colorized color resist layers by a photo-lithography process, wherein the colorized color resist layers include red color resist layers 71, green color resist layers 72, and transparent color resist layers 73. The red color resist layers 71 are prepared by using the photo-lithography process of red photoresist, and the green color resist layers 72 are prepared using the photo-lithography process of green photoresist, thereby effectively reducing a blue light transmission in the backlight substrate and improving color purity and contrast of the display devices.

S80, depositing an insulating layer 6 on a side of the colorized color resist layers by a chemical vapor deposition method. The insulating layer 6 is made of silicon dioxide, a silicon dioxide layer can prevent the black pixel defining layer 54 from affecting a lower photoresist, and can also prevent erosion between an upper photoresist layer and the lower photoresist layer. At the same time, planarizing horn-shaped overlapping points (BM overlays) can be formed between the red color resist layers 71, the green color resist layers 72, and the black matrixes 74.

S90, forming a black pixel defining layer 54 on a side of the insulating layer facing away from the colorized color resist layers by the photo-lithography process, wherein the black pixel defining layer 54 is disposed opposite to the black matrixes 74.

S100, alternately injecting the red quantum dots and the green quantum dots in various regions separated by the black pixel defining layer 54. In other words, the red quantum dot regions 71, the green quantum dot regions 72, and the transparent quantum dot regions 73 are respectively formed in different regions defined by the black pixel defining layer 54.

Lastly, assembling the backlight substrate and the color filter substrate:

S110, correspondingly pairing a side of the polyimide film 2 to a side of a colorized quantum dot layer 7.

Therefore, the display panel and a manufacturing method of the display panel provided by the present disclosure have following beneficial effects: firstly, in the micro-LED display panel provided by the present disclosure, the blue micro-LED layer has a certain preset thickness, ranging from 90 um to 190 um, thereby avoiding a possibility of pressure crushing the blue micro-LED layer during installation of the upper and the lower substrates due to a height of the chips being too high. Secondly, in the display panel provided by the present disclosure, a white adhesive layer is provided around the blue micro-LED layer, and the white adhesive layer surrounds the blue micro-LED layer to protect the blue micro-LED layer, thereby preventing the blue micro-LED layer from being damaged during a manufacturing process. The white adhesive layer can also reflect a light emitted by the blue micro-LED layer, so all the light is gathered in an emission direction at a bottom of the display panel, thereby improving a utilization rate, brightness and contrast of light. Furthermore, the thickness of the white adhesive layer is greater than the thickness of the blue micro-LED layer, so during the process of pairing the upper and the lower substrates, an upper surface and a lower surface of the blue micro-LEDs can also be protected to prevent the blue micro-LEDs from being crushed or broken by pressure and affecting display quality. Lastly, the color resist layer includes colorized color resist layers and the colorized quantum dot layer, the colorized color resist layers includes red color resist layers, green color resist layers and transparent color resist layers; the colorized quantum dot layer includes red quantum dot regions, green quantum dot regions, and transparent regions; the colorized color resist layers with various colors are disposed opposite to the blue micro-LED layer and are separated from each other via the black matrixes, thereby avoiding the crosstalk of the display panel, which affects the display quality of the display panel, and further improving the brightness and contrast of the red, green and blue sub-pixels.

The display panel and the manufacturing method of the display panel provided by the embodiments of the present disclosure have been described in detail above, in this article, specific examples are used to explain a principle and an implementation of a present disclosure. descriptions of above embodiments are only used to help understand technical solutions and core ideas of the present disclosure; those of ordinary skill in prior art should understand that they can still modify the technical solutions described in the foregoing embodiments, or equivalently replace some of technical features; and these modifications or substitutions do not deviate an essence of corresponding technical solutions from a scope of the technical solutions of the embodiments of the present disclosure.

What is claimed is:

1. A display panel, comprising:
a first substrate;
a second substrate disposed opposite to the first substrate;
a driving circuit disposed opposite to the first substrate and adjacent to a side of the second substrate; and
a color resist layer disposed opposite to the driving circuit and adjacent to a side of the first substrate;
wherein the color resist layer comprises colorized color resist layers and a colorized quantum dot layer, the driving circuit is a bottom-emission type light-emitting-diode (LED) driving circuit, and quantum dots or scattering particles are disposed in the colorized quantum dot layer.

2. The display panel in claim 1, wherein the driving circuit comprises a blue micro-LED layer and an adhesive layer disposed around the blue micro-LED layer.

3. The display panel in claim 2, wherein the adhesive layer is a white adhesive layer.

4. The display panel in claim 2, wherein a thickness of the white adhesive layer is greater than a thickness of the blue micro-LED layer, and the blue micro-LED layer has a certain preset thickness.

5. The display panel in claim 4, wherein the preset thickness of the blue micro-LED layer ranges from 90 um to 190 um.

6. The display panel in claim 1, wherein the colorized color resist layers comprise red color resist layers, green color resist layers, and transparent color resist layers, the colorized quantum dot layer comprises red quantum dot regions, green quantum dot regions, and transparent regions, and the colorized color resist layers with various colors are disposed opposite to the blue micro-LED layer and are separated from each other.

7. The display panel in claim 6, wherein the red color resist layers are disposed opposite to the red quantum dot regions, the green color resist layers are disposed opposite to the green quantum dot regions, and the transparent color resist layers are disposed opposite to the transparent regions.

8. The display panel in claim 1, wherein a polyimide film and a thin film transistor layer are further disposed between the driving circuit and the second substrate, the thin film transistor layer is electrically connected to the driving circuit, a thickness of the polyimide film is less than a thickness of the blue micro-LED layer, and the polyimide film has a certain preset thickness.

9. The display panel in claim 8, wherein the preset thickness of the polyimide film ranges from 10 um to 19 um.

10. The display panel in claim 1, wherein the first substrate and the second substrate are glass substrates.

11. A display panel, comprising:
a first substrate;
a second substrate disposed opposite to the first substrate;
a driving circuit disposed opposite to the first substrate and adjacent to a side of the second substrate; and
a color resist layer disposed opposite to the driving circuit and adjacent to a side of the first substrate;
wherein the color resist layer comprises colorized color resist layers and a colorized quantum dot layer, and the driving circuit is a bottom-emission type LED driving circuit.

12. The display panel in claim 11, wherein the driving circuit comprises a blue micro-LED layer and an adhesive layer disposed around the blue micro-LED layer.

13. The display panel in claim 12, wherein the adhesive layer is a white adhesive layer.

14. The display panel in claim 12, wherein a thickness of the white adhesive layer is greater than a thickness of the blue micro-LED layer, and the blue micro-LED layer has a certain preset thickness.

15. The display panel in claim 14, wherein the preset thickness of the blue micro-LED layer ranges from 90 um to 190 um.

16. The display panel in claim 11, wherein the colorized color resist layers comprise red color resist layers, green color resist layers, and transparent color resist layers, the colorized quantum dot layer comprises red quantum dot regions, green quantum dot regions, and transparent regions, and the colorized color resist layers with various colors are disposed opposite to the blue micro-LED layer and are separated from each other.

17. The display panel in claim 16, wherein the red color resist layers are disposed opposite to the red quantum dot regions, the green color resist layers are disposed opposite to the green quantum dot regions, and the transparent color resist layers are disposed opposite to the transparent regions.

18. The display panel in claim 11, wherein a polyimide film and a thin film transistor layer are further disposed between the driving circuit and the second substrate, the thin film transistor layer is electrically connected to the driving circuit, a thickness of the polyimide film is less than a thickness of the blue micro-LED layer, and the polyimide film has a certain preset thickness.

19. The display panel in claim 18, wherein the preset thickness of the polyimide film ranges from 10 um to 19 um.

20. A manufacturing method of a display panel, comprising manufacturing a backlight substrate and manufacturing a color filter substrate;
firstly, steps for manufacturing the backlight substrate, comprising:
S10, providing a third substrate and depositing a polyimide film on a side of the third substrate;
S20, forming a thin film transistor layer on a side of the polyimide film facing away from the third substrate;
S30, forming a blue micro-LED layer on a side of the thin film transistor layer facing away from the polyimide film;
S40, forming a second substrate on a side of the blue micro-LED layer facing away from the thin film transistor layer; and
S50, peeling off the third substrate by a laser peeling method;
then, steps for manufacturing the color filter substrate, comprising:
S60, forming black matrixes on a side of a first substrate to separate various color resist layers;
S70, manufacturing colorized color resist layers by a photo-lithography process, wherein the colorized color resist layers comprise red color resist layers, green color resist layers, and transparent color resist layers;
S80, depositing an insulating layer on a side of the colorized color resist layers by a chemical vapor deposition method;
S90, forming a black pixel defining layer on a side of the insulating layer facing away from the colorized color resist layers by another photo-lithography process, wherein the black pixel defining layer is disposed opposite to the black matrixes; and
S100, injecting red quantum dots and green quantum dots alternately into various regions separated by the black pixel defining layer; and
lastly, assembling the backlight substrate and the color filter substrate:
S110, pairing the side of the polyimide film correspondingly to a side of a colorized quantum dot layer.

* * * * *